(12) United States Patent
Malaquin et al.

(10) Patent No.: US 10,429,436 B2
(45) Date of Patent: Oct. 1, 2019

(54) METHOD, DEVICE AND SYSTEM FOR MEASURING AN ELECTRICAL CHARACTERISTIC OF A SUBSTRATE

(71) Applicant: Soitec, Bernin (FR)

(72) Inventors: Cédric Malaquin, Pontcharra (FR); Jean-Pierre Raskin, Belgique (FR); Eric Desbonnets, Lumbin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 15/546,252

(22) PCT Filed: Jan. 19, 2016

(86) PCT No.: PCT/EP2016/050977
§ 371 (c)(1),
(2) Date: Jul. 25, 2017

(87) PCT Pub. No.: WO2016/120122
PCT Pub. Date: Aug. 4, 2016

(65) Prior Publication Data
US 2018/0024186 A1    Jan. 25, 2018

(30) Foreign Application Priority Data
Jan. 27, 2015 (FR) .................... 15 50606

(51) Int. Cl.
*G01R 31/26* (2014.01)
*G01R 31/28* (2006.01)
(Continued)

(52) U.S. Cl.
CPC ..... *G01R 31/2822* (2013.01); *G01R 29/0878* (2013.01); *G01R 29/12* (2013.01);
(Continued)

(58) Field of Classification Search
CPC ............ G01R 31/2886; G01R 31/2648; G01R 31/2822
(Continued)

(56) References Cited

U.S. PATENT DOCUMENTS 5,225,771 A    7/1993   Leedy
2007/0040565 A1 2/2007  Jayabalan et al.
(Continued)

FOREIGN PATENT DOCUMENTS

CN    1568433        1/2005
FR    2985812 A1     7/2013
(Continued)

OTHER PUBLICATIONS

Taiwanese Search Report for Taiwanese Application No. 105101586 dated Mar. 6, 2018, 1 page.
(Continued)

*Primary Examiner* — Reena Aurora
(74) *Attorney, Agent, or Firm* — TraskBritt

(57) ABSTRACT

The disclosure relates to a device for measuring an electrical characteristic of a substrate comprising a support made of a dielectric material having a bearing surface, the support comprising an electrical test structure having a contact surface flush with the bearing surface of the support, the bearing surface of the support and the contact surface of the electrical test structure being suitable for coming into close contact with a substrate. The measurement device also comprises at least one connection bump contact formed on another surface of the support and electrically linked to the electrical test structure. This disclosure also relates to a system for characterizing a substrate and a method for measuring a characteristic of a substrate employing the measurement device.

19 Claims, 2 Drawing Sheets

(51) Int. Cl.
*G01R 29/08* (2006.01)
*G01R 29/12* (2006.01)

(52) U.S. Cl.
CPC ..... *G01R 31/2648* (2013.01); *G01R 31/2831* (2013.01); *G01R 31/2887* (2013.01); *G01R 31/2889* (2013.01)

(58) Field of Classification Search
USPC .................................................... 324/762.01
See application file for complete search history.

(56) References Cited

U.S. PATENT DOCUMENTS

| | | | |
|---|---|---|---|
| 2008/0083922 | A1 | 4/2008 | Lee et al. |
| 2010/0230789 | A1* | 9/2010 | Yorita ............... H01L 23/3121 257/659 |
| 2011/0207242 | A1 | 8/2011 | Loiselet |
| 2012/0074976 | A1 | 3/2012 | Durbin et al. |
| 2013/0265071 | A1 | 10/2013 | Johnson |
| 2014/0175524 | A1* | 6/2014 | O'Donnell ............. H01L 25/16 257/253 |

FOREIGN PATENT DOCUMENTS

| | | |
|---|---|---|
| TW | 201403093 A | 1/2014 |
| TW | M469489 U | 1/2014 |
| TW | 201447326 A | 12/2014 |

OTHER PUBLICATIONS

International Search Report for International Application No. PCT/EP2016/050977 dated Feb. 24, 2016, 4 pages.
International Written Opinion for International Application No. PCT/EP2016/050977 dated Feb. 24, 2016, 5 pages.

* cited by examiner

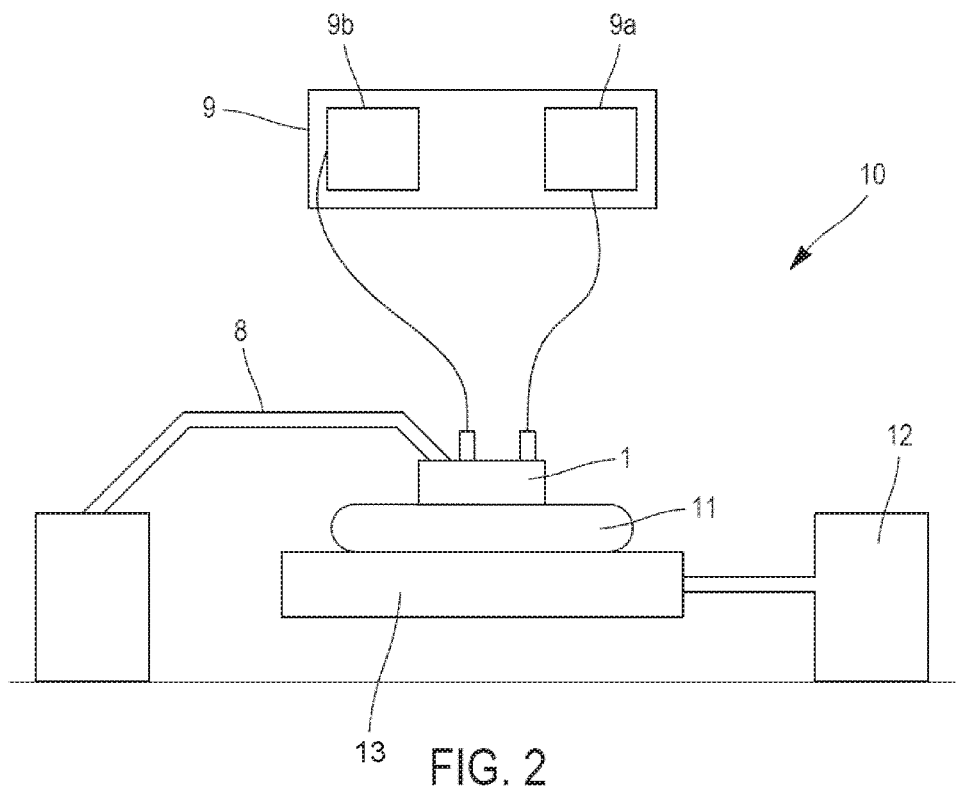
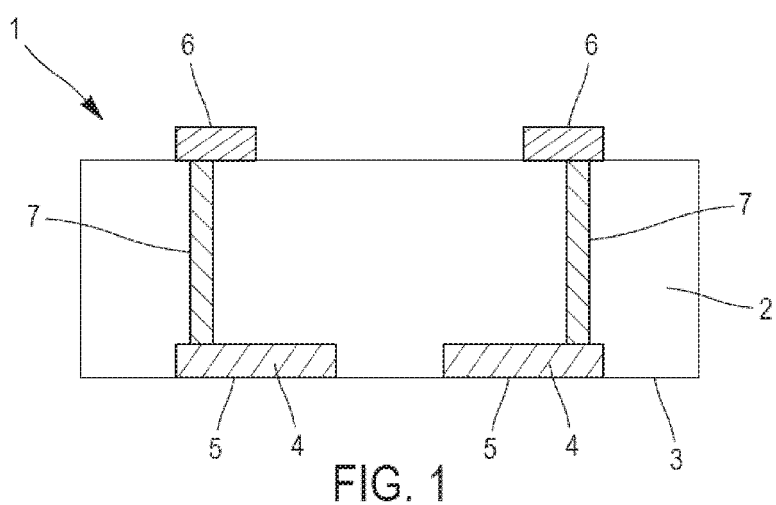

METHOD, DEVICE AND SYSTEM FOR MEASURING AN ELECTRICAL CHARACTERISTIC OF A SUBSTRATE

CROSS-REFERENCE TO RELATED APPLICATIONS

This application is a national phase entry under 35 U.S.C. § 371 of International Patent Application PCT/EP2016/050977, filed Jan. 19, 2016, designating the United States of America and published in English as International Patent Publication WO 2016/120122 A1 on Aug. 4, 2016, which claims the benefit under Article 8 of the Patent Cooperation Treaty to French Patent Application Serial No. 1550606, filed Jan. 27, 2015, the disclosures of which are incorporated herein in their entireties by this reference.

TECHNICAL FIELD

This disclosure relates to the field of the characterization of the electrical, notably radio frequency (RF), performance levels of substrates that can be employed for the fabrication of microelectronic, optoelectronic, micromechanical or photovoltaic devices.

BACKGROUND

Integrated devices are usually formed on substrates which serve mainly as supports for their fabrication. However, the increase in the degree of integration and in the performance levels expected of these devices is leading to an increasingly significant coupling between their performance levels and the characteristics of the substrate on which they are formed. Such is particularly the case with RF devices, which deal with signals with a frequency of between approximately 3 kHz and 300 GHz, which are notably applicable in the field of telecommunications (telephony, Wi-Fi, Bluetooth, etc.).

As an example of device/substrate coupling, the electromagnetic fields, derived from the high-frequency signals that are propagated in the devices, penetrate into the depth of the substrate and interact with any charge carriers that are located therein. The result thereof is a pointless consumption of a portion of the energy of the signal through insertion loss and possible influences between components by crosstalk.

It is therefore particularly important to ensure a suitable match between the electrical characteristics of the substrate and the performance levels expected of the devices.

One usual technique for measuring the electrical characteristics of a substrate for the fabrication of RF devices involves forming a test structure on this substrate by employing the usual microelectronic fabrication means: deposition, masking, etching, etc. The test structure can thus be designed to measure a particular characteristic of the substrate (such as, for example, its resistance, its linearity, its capacitance, its permittivity) and/or characterize its suitability for a particular application considered. The test structure can, for example, consist of coplanar lines in which a signal from a generator is propagated. A signal analyzer is used to identify the power dissipated in the substrate and deduce therefrom the insertion loss characteristic.

The known techniques, like those which have just been described, are not entirely adequate. In fact, they require the implementation of significant means, for example, for the production of the test structures on the substrate, which are slow and costly. These means cannot be automated, or can be automated only to a small extent, and they are, moreover, destructive techniques. They are not therefore suitable for operating a substrate production control or substrate quality control on the input side of a device production line. Each measured characteristic must, in addition, be the subject of a separate test. Finally, these known techniques, although they make it possible to locally measure an electrical characteristic, are not suited to producing a mapping of this characteristic over the entire surface of the substrate. They do not therefore make it possible to accurately characterize this substrate.

BRIEF SUMMARY

One aim of the disclosure is, therefore, to propose a method and a device for measuring an electrical characteristic of a substrate and a system for characterizing a substrate which are easy to implement, inexpensive and multi-purpose.

Another aim of the disclosure is to propose a measurement method and a device and an accurate characterization system, which notably make it possible to provide the mapping of an electrical characteristic over the entire surface of a substrate.

Another aim of the disclosure is also to propose a method and a device for measuring an electrical characteristic and a system for characterizing a substrate upon which it is possible to base a control of production or of quality of these substrates.

In order to achieve at least one of these aims, the object of the disclosure proposes a device for measuring an electrical characteristic of a substrate comprising a support made of a dielectric material having a bearing surface, the support comprising an electrical test structure having a contact surface flush with the bearing surface of the support, the bearing surface of the support and the contact surface of the electrical structure being suitable for coming into close contact with a substrate. The measurement device also comprises at least one connection bump contact formed on another surface of the support and electrically linked to the electrical structure.

Thus, the measurement device can be applied to a chosen point of a main face of the substrate to be tested for a measurement to be able to be performed rapidly, without damaging the substrate.

Advantageously, the measured characteristic is a radio frequency (RF) characteristic and the electrical test structure comprises at least one active or passive RF component. The RF component can be a transmission line, an inductor, a contactor, a crosstalk characterizing component, an antenna, a resonator.

There is thus a device for measuring an RF characteristic of a substrate.

In a variant, the measured characteristic can also be a static characteristic.

Particularly advantageous, the dielectric support is rigid, which facilitates its handling and its placement in close contact with the substrate.

Preferably, the connection bump contact of the support is formed on the face opposite the bearing surface of the support, which simplifies its interconnection in the system.

Advantageously, the support comprises a via filled with an electrically conductive material to electrically link the electrical test structure to the connection bump contact. The device is thus more compact.

The object of the disclosure relates also to a system for characterizing a substrate comprising the measurement device according to the disclosure.

Advantageously, the characterization system comprises a plate for positioning the substrate thereon, and this plate can be configured to apply a voltage to the substrate.

Particularly advantageously, the characterization system also comprises means for relatively displacing the measurement device with respect to the plate. These means make it possible to easily produce a mapping of the electrical characteristic measured over the entire surface of the substrate.

Preferentially, the characterization system comprises a holding member, secured to the support, and configured to place the support in close contact with the substrate.

Preferentially, the characterization system comprises an analysis computer connected to the connection bump contact of the support, the analysis computer comprising an electrical signal source and a signal analyzer. There is then an integrated measurement system capable of applying, tapping and processing a measurement signal to provide the characterization information.

Another object of the disclosure relates to a method for measuring an electrical characteristic of a substrate comprising the following steps:
a) supplying a substrate having a main face;
b) placing the main face of the substrate in close contact, by joining in a contact zone, with a contact surface of an electrical test structure;
c) propagating a signal in the electrical test structure while maintaining the close contact;
d) measuring the signal propagated to determine the electrical characteristic of the substrate.

According to other features of this method, taken alone or in combinations:
the electrical test structure is included in a support made of a dielectric material, the contact surface of the electrical structure being flush with a bearing surface of the support.
The step of placing in close contact consists in placing the support on the main face of the substrate, in the contact zone, then in applying a controlled holding force on the support during the propagation step c) and the measurement step d).
The measurement sequence, consisting in repeating the performance of the succession of the steps b) through d).
The measurement sequence is applied in distinct contact zones of the main face of the substrate.
The method comprises, after the measurement step d), a step e) of removal of the electrical structure from the substrate.

BRIEF DESCRIPTION OF THE DRAWINGS

Other features and advantages of the disclosure will emerge from the detailed description of the disclosure that follows with reference to the attached figures in which:

FIG. 1 represents a schematic block diagram of the measurement device according to the disclosure;

FIG. 2 represents a schematic block diagram of the system for characterizing a substrate according to the disclosure;

DETAILED DESCRIPTION

Figure 3:
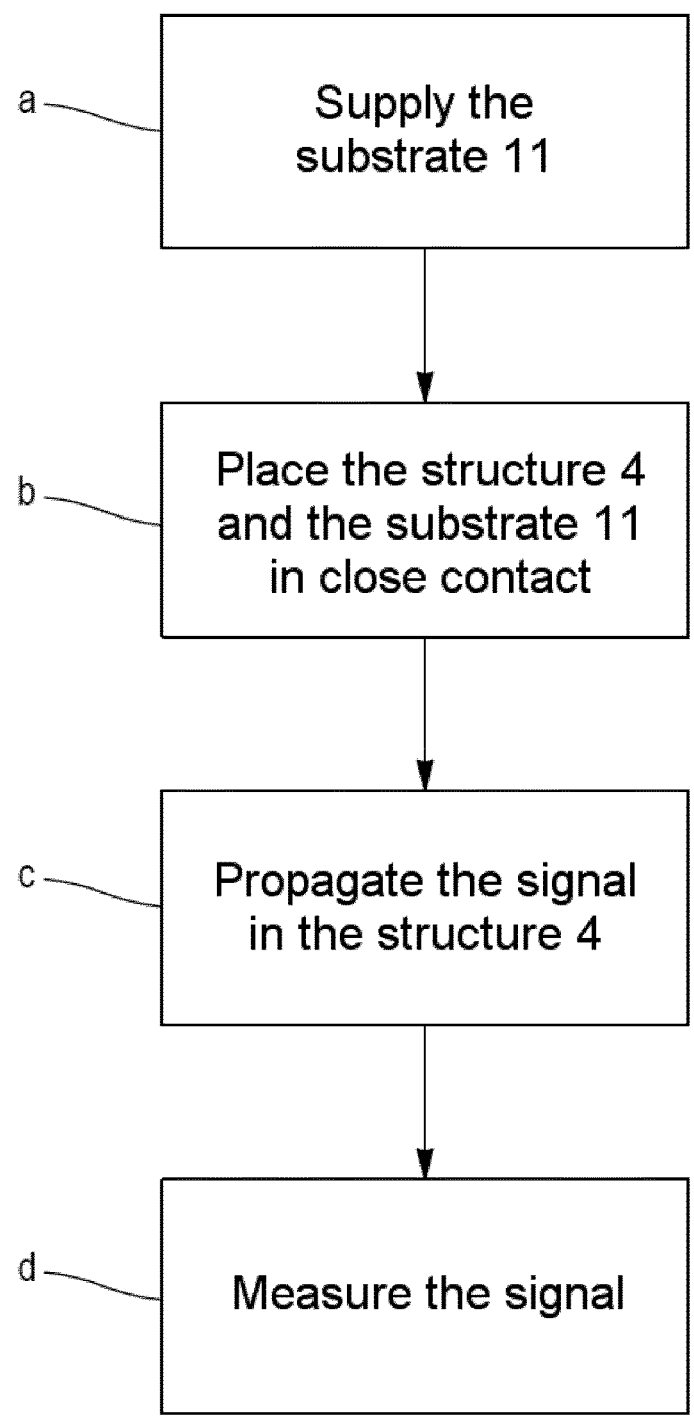
FIG. 3 represents the main steps of the measurement method according to the disclosure.

Referring to FIG. 2, a system 10 for characterizing a substrate 11 has been represented.

The substrate 11 can be of any kind: it can be a semiconductive substrate, such as a silicon substrate, or an insulating substrate, for example made of sapphire. It can also be a compound substrate such as a silicon-on-insulator substrate. Preferably, the substrate is unprocessed, that is to say that the substrate does not contain any functional devices.

In the system 10, a plate 13 has been provided to receive the substrate 11. As is well known in itself, the plate can be provided with means making it possible to hold the substrate in place, mechanically or even by vacuum. The substrate 11 can be positioned on the plate via a manipulating robot which is not represented in FIG. 2.

The characterization system 10 also comprises a measurement device 1 for measuring an electrical characteristic of the substrate, a detailed description of which will be given later. This measurement device makes it possible to apply and/or extract a signal propagated on the surface and in proximity to the surface of the substrate 11.

To this end, and as is represented in FIG. 2, the measurement device is placed in close contact with the substrate 11. To do this, the system 10 is provided with a holding member 8 secured to the measurement device 1. It can, for example, be an articulated arm that can be controlled by a computer 9, and capable of applying a controlled holding force onto the measurement device 1 in order to press it against the substrate 11.

The measurement device 1 can comprise, on the side of its bearing surface 3 in contact with the substrate 11, sensors making it possible to adjust the holding force applied by the holding member 8 onto the measurement device 1.

The characterization system 10 is also provided with means that make it possible to adjust the relative position of the plate 13 with respect to the measurement device 1. The measurement device 1 can then be placed and moved to a chosen point of the main face of the substrate 11.

In a first configuration of the system, these means can correspond to the articulated arm forming the holding member 8 given by way of example previously.

In a second configuration, the plate 13 can be made mobile by a robot 12 capable of moving in all the directions of the plane in which it lies. This second configuration is preferred, because it avoids moving the measurement device 1 which can be fragile.

Obviously, these two means of adjusting the relative position of the plate 13 and of the measurement device 1 can be combined.

The characterization system also comprises an analysis computer 9. This computer can handle the control of the different mobile elements of the system (the holding member 8, the robot 12) and the sequencing of the measurement method which will be described later. To this end, it is linked to all the elements of the system with which it is likely to communicate.

The analysis computer 9 can also comprise an electrical signal generator 9a and an analyzer 9b. The electrical signal generator 9a and/or the analyzer 9b are connected to the connection bump contact(s) of the measurement device 1. It is thus possible to apply, propagate and/or tap a signal from the measurement device 1.

The measurement can be processed by the computer 9 to supply the characterization of the substrate 11.

A set of measurements can also be processed by the computer 9 to establish a more comprehensive characterization, such as a characterization mapping of the substrate 11.

The system 10 therefore forms an automated assembly for characterizing a substrate which is well suited to incorporation in a production line, for example for substrate production control or for substrate quality control.

An essential element of the system 10 lies in the measurement device 1 which will be described in the following paragraphs.

The inventors of the present application found, totally unexpectedly, that it was not essential to form the electrical test structures directly on and in the substrate 11 by using the traditional techniques of deposition, masking, etching of the microelectronic to apply and extract usable electrical signals from this test structure.

They found in fact that it was sufficient, subject to certain precautions being taken, to position these electrical test structures in close contact with the substrate by joining them together.

FIG. 1 represents a schematic block diagram of such a measurement device 1 according to the disclosure. It comprises a support 2 made of a dielectric material, such as glass, alumina, a polymer, quartz, sapphire, SiC, etc.

Preferably, particularly in the case where the measurement device 1 is incorporated in the characterization system which has been described previously, this support 2 is rigid.

The support 2 has a bearing surface 3 and comprises an electrical test structure 4 with an exposed contact surface 5 flush with the bearing surface 3 of the support 2. This side of the measurement device 1 therefore has a planar surface, made up of the bearing surface 3 and the contact surface 5, suitable for coming into close contact with the substrate 11.

"Close contact" should be understood to mean, in the present application, that a satisfactory electromagnetic coupling is formed between the electrical test structure 4 and the substrate 11.

This satisfactory coupling is obtained, for example, when the surfaces in contact are sufficiently planar and/or smooth to avoid the formation of air pockets between the measurement device 1 and the substrate 11, which could affect the propagation of the electrical signal in the electrical test structure 4 or in the substrate 11 and disturb the measurement.

A holding force applied onto the measurement device 1 contributes to this close contact condition.

The electrical test structure 4 can consist of any kind of RF components, which are active or passive, making it possible to propagate a signal useful to the characterization of the substrate. They can be transmission lines, an inductor, a crosstalk characterizing component, switches, antennas, resonators, etc. The electrical test structure 4 is, therefore, chosen according to the characteristic or the performance of the substrate that is to be characterized: resistance, linearity, capacitance, permittivity, etc.

As is well known in itself, the electrical test structure 4 can be formed by a number of elements, such as lines or bump contacts that are electrically separate, but coupled electromagnetically together and with the substrate 11.

In order to be able to apply and extract the signal which is propagated in the electrical test structure 4, the support 2 is provided with at least one connection bump contact 6 formed on a surface of the support 2 distinct from the bearing surface 3 and electrically linked to the electrical test structure 4.

Preferably, the bump contact or contacts are formed on the surface opposite the bearing surface 3 of the support 2. Also preferably, the support 2 comprises one or more vias 7 filled with an electrically conductive material to electrically link the electrical test structure 4 and the connection bump contacts 6.

There now follows a description, with reference to FIG. 3, of the method for measuring an electrical characteristic of a substrate 11.

This method comprises a first step a) consisting in supplying the substrate 11 to be measured. As has been seen previously, this step can consist in placing, in an automated manner, the substrate 11 on a plate 13 of the characterization system 10.

In a second step b), the contact surface 5 of the electrical test structure 4 is placed in close contact, by joining together, with a contact zone of the main face of the substrate 11.

This step can consist in employing the holding member 8 of the characterization system secured to the measurement device 1 to position this measurement device 1 against the substrate 11. Optionally, a controlled holding force is applied. During this step, and as was explained previously, a satisfactory electromagnetic coupling is created between the electrical test structure 4 and the substrate 11.

In a third step c), a signal is propagated in the electrical test structure 4 while maintaining the close contact with the substrate 11. In a final step d), the propagated signal is measured to determine the electrical characteristic of the substrate 11.

The signal can be obtained from the electrical signal generator 9a of the computer 9 and the measurement can be performed by the analyzer 9b of the computer 9. At the end of this method, it is possible to interrupt the close contact during a removal step, and disassemble, for example via the holding member 8, the electrical test structure 4 from the substrate 11. It is then possible to directly position another substrate for a new measurement.

It should be noted that this measurement is not destructive to the substrate, and that the rate of the measurements can be very rapid.

Furthermore, the measurement sequence comprising the successive steps b) to d) can be repeated on a same substrate 11.

This repetition can be performed in a same zone of contact of the main face of the substrate 11, for example to average a set of measurements.

However, advantageously, the repeated measurement sequences are applied in distinct contact zones of the main face of the substrate 11. This makes it possible to produce a mapping of the characteristic measured over the entire surface of the substrate very effectively.

Obviously, the disclosure is not limited to the implementation described and variant embodiments can be added thereto without in any way departing from the scope of the disclosure, as is defined by the following claims.

Thus, although the measurement of an RF characteristic of a substrate has been taken as example, the disclosure is not limited to this type of measurement. It would also be possible to measure a static electrical characteristic, the electrical test structure then being able to consist of one or more metal blocks, making it possible to apply or measure a static quantity.

Moreover, the disclosure is not limited to a particular number of electrical test structures and/or of connection bump contacts. These elements of the measurement device 1 will be able to be duplicated as many times as necessary.

Finally, it is not essential for the material of the support 2 to be rigid and for the close contact to be obtained by the application of a holding force. It is, in fact, possible to envisage having the material of the support 2 be flexible, making it possible to ensure a close contact with a non-planar substrate to be characterized. It may also be provided with an adhesive layer allowing it to be positioned stably on the substrate 11 during the measurement, the adhesive favoring the placement in close contact and the electromagnetic coupling with the substrate.

The invention claimed is:

1. A measurement device for measuring a radiofrequency characteristic of a substrate comprising:
   a support made of a dielectric material having a bearing surface, the support comprising an electrical test structure comprising at least one active or passive radiofrequency component and having a contact surface flush with the bearing surface of the support, the bearing surface of the support and the contact surface of the electrical test structure forming a planar surface suitable for coming into contact with the substrate; and
   at least one connection bump contact formed on another surface of the support and electrically linked to the electrical test structure.

2. The measurement device according to claim 1, wherein the measured electrical characteristic is static, and the electrical test structure comprises a block formed from an electrically conductive material.

3. The measurement device according to claim 1, wherein the electrical test structure comprises at least one element chosen from the group consisting of a transmission line, an inductor, a cross-talk characterizing component, a switch, an antenna, and a resonator.

4. The measurement device according to claim 1, wherein the support is rigid.

5. The measurement device according to claim 1, wherein the support is flexible.

6. The measurement device according to claim 1, wherein the dielectric material of the support is chosen from the group consisting of glass, alumina, a polymer, quartz, sapphire, and SiC.

7. The measurement device according to claim 1, wherein the connection bump contact is formed on the surface opposite the bearing surface of the support.

8. The measurement device according to claim 7, wherein the support comprises a via filled with an electrically conductive material to electrically link the electrical test structure and the connection bump contact.

9. A characterization system for characterizing a substrate, comprising:
   a measurement device as recited in claim 1; and
   a plate for receiving the substrate recited in claim 1.

10. The characterization system according to claim 9, wherein the plate is configured to apply a voltage to the substrate.

11. The characterization system according to claim 9, further comprising means for relatively displacing the measurement device with respect to the plate.

12. The characterization system according to claim 9, wherein the measurement device is secured to a holding member configured to place the support in close contact with the substrate.

13. The characterization system according to claim 9, further comprising an analysis computer connected to the connection bump contact of the measurement device.

14. The characterization system according to claim 13, wherein the analysis computer comprises an electrical signal source and an electrical signal analyzer.

15. A measurement method for measuring a radiofrequency characteristic of a substrate comprising the following steps:
   a) supplying a substrate having a main face;
   b) placing the main face of the substrate in contact, by joining in a contact zone, with a planar surface formed of a contact surface of an electrical test structure comprising at least one active or passive radiofrequency component and of a bearing surface of a support made of a dielectric material, the contact surface of the electrical test structure being flush with the bearing surface of the support;
   c) propagating a signal in the electrical structure while maintaining the contact; and
   d) measuring the signal propagated to determine the radiofrequency characteristic of the substrate.

16. The measurement method according to claim 15, wherein placing in contact comprises placing the support on the main face of the substrate in the contact zone, then applying a controlled holding force on the support during the propagation step c).

17. The measurement method according to claim 15, further comprising successively repeating steps b) through d).

18. The measurement method according to claim 17, wherein the repetition of steps b) through d) is applied in distinct contact zones of the main face of the substrate.

19. The measurement method according to claim 15, further comprising, after the propagation step c), a step e) of removal of the electrical test structure from the substrate.

* * * * *